United States Patent
Kim et al.

(10) Patent No.: US 9,236,286 B2
(45) Date of Patent: Jan. 12, 2016

(54) MICRO ELECTRO MECHANICAL SYSTEMS SENSOR MODULE PACKAGE AND METHOD OF MANUFACTURING THE SAME

(71) Applicant: SAMSUNG ELECTRO-MECHANICS CO., LTD., Suwon-si (KR)

(72) Inventors: Tae Hyun Kim, Suwon-si (KR); Heung Woo Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 82 days.

(21) Appl. No.: 14/188,161

(22) Filed: Feb. 24, 2014

(65) Prior Publication Data

US 2015/0153372 A1 Jun. 4, 2015

(30) Foreign Application Priority Data

Dec. 2, 2013 (KR) .................. 10-2013-0148483

(51) Int. Cl.
| | |
|---|---|
| *G01R 33/02* | (2006.01) |
| *H01L 21/70* | (2006.01) |
| *G01P 15/08* | (2006.01) |
| *G01C 19/5769* | (2012.01) |

(52) U.S. Cl.
CPC ............ *H01L 21/70* (2013.01); *G01C 19/5769* (2013.01); *G01P 15/0802* (2013.01); *G01R 33/02* (2013.01); *H01L 2224/48091* (2013.01)

(58) Field of Classification Search
CPC ........... G01B 7/003; H01L 2924/1461; G01R 31/2891; G01R 33/02
USPC .......................................................... 324/244
See application file for complete search history.

(56) References Cited

U.S. PATENT DOCUMENTS

| 8,847,375 B2 * | 9/2014 | Shah et al. ................... 257/686 |
| 2013/0285165 A1 * | 10/2013 | Classen et al. ............... 257/415 |

FOREIGN PATENT DOCUMENTS

KR  10-2010-0009685  1/2010

* cited by examiner

*Primary Examiner* — Reena Aurora
(74) *Attorney, Agent, or Firm* — NSIP Law

(57) ABSTRACT

Disclosed herein is a MEMS sensor module package. The MEMS sensor module package according to a preferred embodiment of the present invention includes: a printed circuit board (PCB); an application specific integrated circuit (ASIC) stacked on the PCB, one side of the ASIC being wire-bonded to the PCB; a MEMS sensor stacked on the ASIC; and a molding encapsulating the MEMS sensor and the ASIC with a resin. Accordingly, the electrical connection distance between a MEMS sensor and an ASIC is shortened so that electrical characteristic may be improved. Further, a sensor module package may be implemented in an ASIC size, so that size reduction may be achieved to meet the requirements of mobile devices.

11 Claims, 4 Drawing Sheets

MICRO ELECTRO MECHANICAL SYSTEMS SENSOR MODULE PACKAGE AND METHOD OF MANUFACTURING THE SAME

CROSS REFERENCE TO RELATED APPLICATION

This application claims the benefit of Korean Patent Application No. 10-2013-0148483, filed on Dec. 2, 2013, entitled "Micro Electro Mechanical Systems Sensor Module Package and Method of Manufacturing the Same," which is hereby incorporated by reference in its entirety into this application.

BACKGROUND OF THE INVENTION

1. Technical Field

The present invention relates to a micro electro mechanical systems (MEMS) sensor module package and a method of manufacturing the same.

2. Description of the Related Art

Micro electro mechanical systems (MEMS), also known as micro machines or micro systems technology, is the technology of manufacturing very small devices in μm or mm size based on semiconductor processing technologies. By processing silicon, crystal, glass or the like, micro mechanical structures may be manufactured such as very large scale integrated circuits (VLSI), micro gears having a thickness half that of a strand of hair, and fingernail-sized hard disks, sensors and actuators. It has a sophisticated three-dimensional structure in which surface micromachining is processed in bulk silicon etching method through evaporation, etching and the like.

A MEMS sensor manufactured by using such MEMS has been used in various applications, for example, a military application such as an artificial satellite, a missile, an unmanned aircraft, a vehicle application such as an air bag for a vehicle, electronic stability control (ESC), a black box for a vehicle, a shaking prevention application of a camcorder, a motion sensing application of a mobile phone or a game console, or the like.

A MEMS sensor is configured with a mass body adhered to an elastic substrate such as a membrane to measure acceleration, angular velocity, force, pressure or the like. That is, with the configuration, a MEMS sensor calculates acceleration by measuring inertial force applied to the mass body, calculates angular velocity by measuring Coriolis force applied to the mass body, and calculates force by measuring external force directly applied to the mass body.

Specifically, acceleration and angular velocity are measured using a MEMS sensor as follows.

First, acceleration may be calculated using Newton's law of motion "F=ma," where "F" represents inertial force applied to the mass body, "m" represents the mass of the mass body, and "a" is acceleration to be measured. Among others, the acceleration a may be obtained by sensing the inertial force F applied to the mass body and dividing the sensed inertial force F by the mass m of the mass body which is a constant.

Further, the angular velocity may be obtained using Coriolis force "F=2 mΩ×v", where "F" represents the Coriolis force applied to the mass body, "m" represents the mass of the mass body, "Ω" represents the angular velocity to be measured, and "v" represents the motion velocity of the mass body. Among others, since the motion velocity v of the mass body and the mass m of the mass body are already known, the angular velocity Ω may be obtained by sensing the Coriolis force (F) applied to the mass body.

Such a MEMS sensor is packaged in a such manner that an application specific integrated circuit (ASIC) is attached on a sensor element using an epoxy or the like, and then each of the elements is electrically connected to a printed circuit board (PCB) by wire bonding.

In such a MEMS sensor module package, since an acceleration sensor and a gyro sensor are separate devices and an ASIC is also separately provided, there are many I/O counts. Therefore, it is very difficult to make the package light, thin and simple with those additional devices.

In this connection, Patent Document 1 teaches that a MEMS chip and an ASIC chip are stacked on a wafer, in which a cap is attached on the MEMS chip and the ASIC chip is attached on the cap, and the ASIC ship and the MEMS chip are electrically connected by wire and molded with a compound resin. Then, the compound resin is selectively removed to form holes for attaching input/output terminals, by which solder balls are soldered onto the ASIC chip.

In conventional MEMS sensor module packages including that disclosed in Patent Document 1, however, as mentioned earlier, since a MEMS chip and an ASIC chip are stacked on a wafer, wafer bonding tools and schemes need to be used in order to manufacture it, but it is difficult to process in a general process. Further, it is also a problem in that yield rate of ASIC chips and MEMS chips may deteriorate during the attaching process.

In addition, wire bonding is made on four surfaces of the ASIC chips and the MEMS chips, and thus the size of a MEMS sensor module package is increased. Further, since the stack structure has a pyramid shape, the space of the PCB is not efficiently utilized and thus additional space may be needed as the number of stacks is increased.

PRIOR ART DOCUMENT

Patent Document (Patent Document 1) Korean Patent Laid-Open Publication No. 2010-0009685

SUMMARY OF THE INVENTION

The present invention has been made in an effort to provide a MEMS sensor module package which has a significantly reduced overall size so as to improve productivity.

Further, the present invention has been made in an effort to provide a MEMS sensor module package which is easily reduced in size.

Moreover, the present invention has been made in an effort to provide a method of manufacturing a MEMS sensor module package capable of easily improving the yield rate by improving the process.

According to a first preferred embodiment of the present invention, there is provided a micro electro mechanical systems (MEMS) sensor module package, including: a printed circuit board (PCB); an application specific integrated circuit (ASIC) stacked on the PCB, one side of the ASIC being wire-bonded to the PCB; a MEMS sensor stacked on the ASIC; and a molding encapsulating the MEMS sensor and the ASIC with a resin.

The MEMS sensor may be a six-axis motion sensor.

The MEMS sensor module package may further include three-axis magnetometer interposed between the ASIC and the PCB.

The MEMS sensor module package may further include a first molding encapsulating the three-axis magnetometer with a resin, wherein the first molding is a separate from the molding.

The three-axis magnetometer may be electrically connected to the PCB through wire bonding.

The three-axis magnetometer may be electrically connected to the PCB through bumps.

According to a second preferred embodiment of the present invention, there is provided a method of manufacturing a micro electro mechanical systems (MEMS) sensor module package, the method including: (a) stacking a MEMS sensor on an application specific integrated circuit (ASIC); (b) stacking the ASIC and the MEMS sensor on a printed circuit board (PCB);(c) wire-bonding one side of the ASIC to the PCB; and (d) encapsulating the ASIC and the MEMS sensor with a resin to form a molding.

Operation (a) may include attaching the MEMS sensor on an ASIC wafer.

The method may further include (a1) dicing the ASIC wafer after die-attaching the MEMS sensor.

The method may further include stacking a three-axis magnetometer on the PCB so as to be electrically connected thereto, before operation (b).

The three-axis magnetometer may be electrically connected to the PCB through wire bonding or bumps.

The method may further include encapsulating the three-axis magnetometer with a resin to form a first molding.

Operation (d) may include applying a liquid or powder resin.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
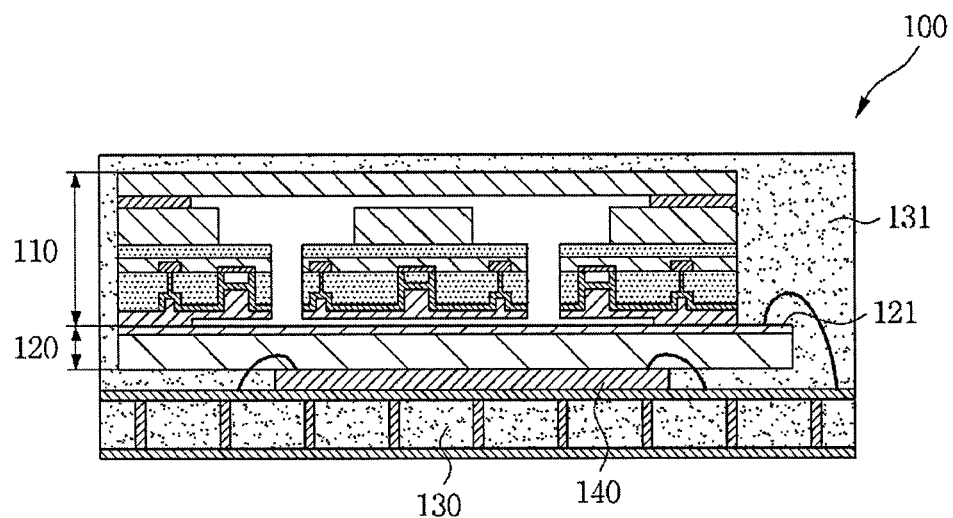
FIG. 1 is a cross-sectional view of a MEMS sensor module package according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

The micro electro mechanical systems (MEMS) sensor module package according to the present invention may easily eliminate wire bonding electrically connecting a MEMS sensor to an application specific integrated circuit (ASIC) by way of configuring the MEMS sensor and the ASIC as a stack structure, such that the module may be implemented in the ASCI size, thereby meeting size reduction requirements required by mobile devices represented by smart phones.

Specifically, the MEMS sensor module package is configured in a such manner that the MEMS sensor and the ASIC are die-attached in a stack structure instead of conventional wire bonding to connect the MEMS sensor to the ASIC, one side of the ASIC is wire-bonded to the PCB, and they are electrically connected to be molded with a resin, thereby shortening electrical connection distance to improve an electrical characteristic and enable size reduction as mentioned earlier. Further, by interposing a magnetometer between the ASIC and the PCB, size reduction may be easier when compared to the structure in which a magnetometer is electrically connected to the outside of the ASIC.

The MEMS sensor includes a motion sensor, which will be described briefly. The motion sensor detects inertial force of a motion to detect inertial working on an inertial body by acceleration applied on a component providing navigation-related information such as acceleration, velocity, direction, distance of a target moving object. The motions sensor is divided into an accelerometer and an angular velocity meter, and laser type and non-mechanical type. The motions sensor is applied to motion sensors in an air bag for a vehicle, in a camcorder, a cellular phone, a home appliance, as well as navigation and control for an airplane and vehicle, for example.

Further, the magnetometer is used for detecting geomagnetism and includes a fluxgate magnetometer using magnetic saturation of ferromagnetic substance of the magnetism used in a rotational coil, a quantum magnetometer using nuclear magnetic resonance of protons, an optical pumping magnetometer using the Zeeman effect of rubidium or cesium. Accordingly, by choosing an appropriated one from the magnetometers and interposing it between the ASIC and the PCB, a MEMS sensor module package may be easily implemented.

In the MEMS sensor module package according to the present invention, a six-axis motion sensor is employed as a MEMS sensor, and a three-axis magnetometer is employed as the magnetometer, such that nine-axis motion sensor module may be implemented.

The MEMS sensor module package may be, for example, manufacture in a such manner that the ASIC and the MEMS sensor are configured as a stack structure using an ASIC wafer, are be subject to a dicing process using sawing to be provided as individual pieces, and are wire-bonded to the PCB.

In addition, the three-axis magnetometer may be electrically connected to the PCB by a bonding process using wire or by a flip chip process using bumps and may be molded with a resin separately from the ASIC and the MEMS sensor.

Hereinafter, preferred embodiments of the present invention will be described in detail with reference to the accompanying drawings.

EXAMPLE 1

As shown in FIG. 1, the MEMS sensor module package 100 according to the first preferred embodiment of the present invention employs a six-axis motion sensor as a MEMS sensor 110 and has a stack structure in which the MEMS sensor 110 is stacked on an ASIC 120 with respect to the drawing.

The ASIC 120 and the MEMS sensor 110 may be electrically connected to each other, for example, in a such manner that a pad 121 formed on the ASIC 120 in a vacuum chamber is bonded to the lower side of the MEMS sensor 110. The pad 121 protrudes from the MEMS sensor 110 at the right side of the drawing and it is electrically connected to the upper side of a printed circuit board 130 by wire bonding.

In addition to the ASIC 120 and the MEMS sensor 110 in the stack structure, the printed circuit board 130 may have a three-axis magnetometer stacked thereon as a magnetometer 140. In this case, the magnetometer 140 and the printed circuit board 130 may be electrically connected to each other by wire bonding.

That is, the magnetometer 140 is interposed between the ASIC 120 and the printed circuit board 130 and has its ends to be electrically connected to the printed circuit board 130 by wire bonding, such that a nine-axis motion sensor module may be easily implemented.

Over the printed circuit board 130 on which the magnetometer 140, the ASIC 120 and the MEMS sensor 110 have been stacked, a molding 131 is formed that generally covers side surfaces and upper portions of the magnetometer 140, the ASIC 120 and the MEMS sensor 110 by applying a liquid or powder epoxy resin or the like. The molding 131 supports the stack structure of the MEMS sensor 110, the ASIC 120 and the magnetometer 140 and seals the wire bonding that electrically connects them to one another.

Accordingly, the MEMS sensor module package 100 according to the first preferred embodiment of the present invention may not only improve electrical characteristics by shortening the electrical connection distance between the MEMS sensor 110 and the ASIC 120 but also reduce the size when compared to conventional technologies by implementing the module substantially the same size as the ASIC 120.

EXAMPLE 2

Figure 2:
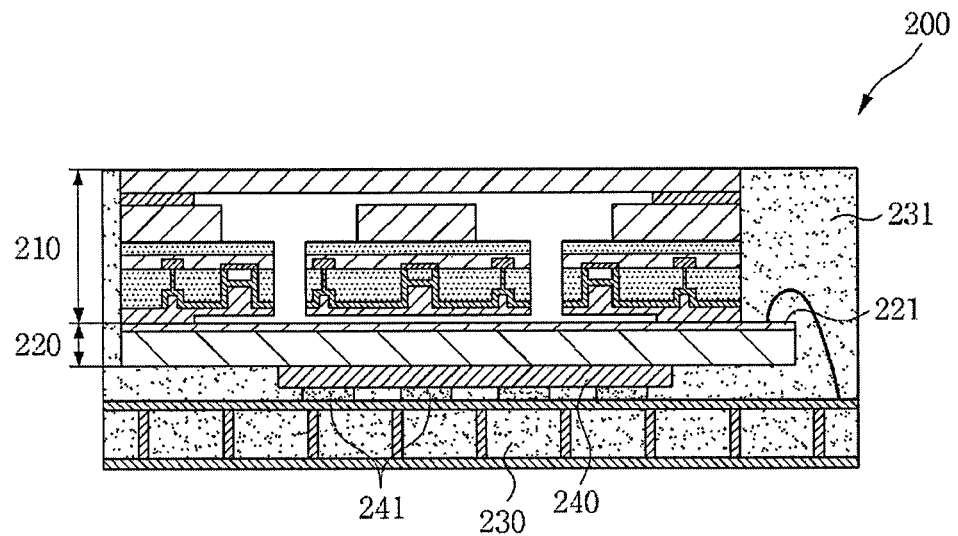
FIG. 2 is a cross-sectional view of a MEMS sensor module package according to a second preferred embodiment of the present invention.

As shown in FIG. 2, the MEMS sensor module package 200 according to the second preferred embodiment of the present invention employs a 6-axis motion sensor as a MEMS sensor 210 and has a stack structure in which an ASIC 220 is stacked under the MEMS sensor 210 with respect to the drawing.

The ASIC 220 and the MEMS sensor 210 may be electrically connected to each other, for example, in a such manner that a pad 221 formed on the ASIC 220 in a vacuum chamber is bonded to the lower side of the MEMS sensor 210. The pad 221 protrudes from the MEMS sensor 210 at the right side of the drawing and is electrically connected to the upper side of a printed circuit board 230 by wire bonding.

In addition to the ASIC 220 and the MEMS sensor 210 in the stack structure, the printed circuit board 230 may have a three-axis magnetometer stacked thereon as a magnetometer 240. In this case, the magnetometer 240 and the printed circuit board 230 may be electrically connected to each other by bumps 241 in flip chip packaging.

That is, the magnetometer 240 is interposed between the ASIC 220 and the printed circuit board 230 and is electrically connected to the printed circuit board 230 by bumps 241, such that a nine-axis motion sensor module may be easily implemented.

Over the printed circuit board 230 on which the magnetometer 240, the ASIC 220 and the MEMS sensor 210 have been stacked, a molding 231 is formed that covers side surfaces of the magnetometer 240, the ASIC 220 and the MEMS sensor 210 by applying a liquid or powder epoxy resin or the like. The molding 231 supports the stack structure of the MEMS sensor 210, the ASIC 220 and the magnetometer 240 and seals the wire bonding that electrically connects them to one another.

Accordingly, the MEMS sensor module package 200 according to the second preferred embodiment of the present invention may not only improve electrical characteristics by shortening the electrical connection distance between the MEMS sensor 210 and the ASIC 220 but also reduce size when compared to conventional technologies by implementing the module in substantially the same size with the ASIC 220.

EXAMPLE 3

Figure 3:
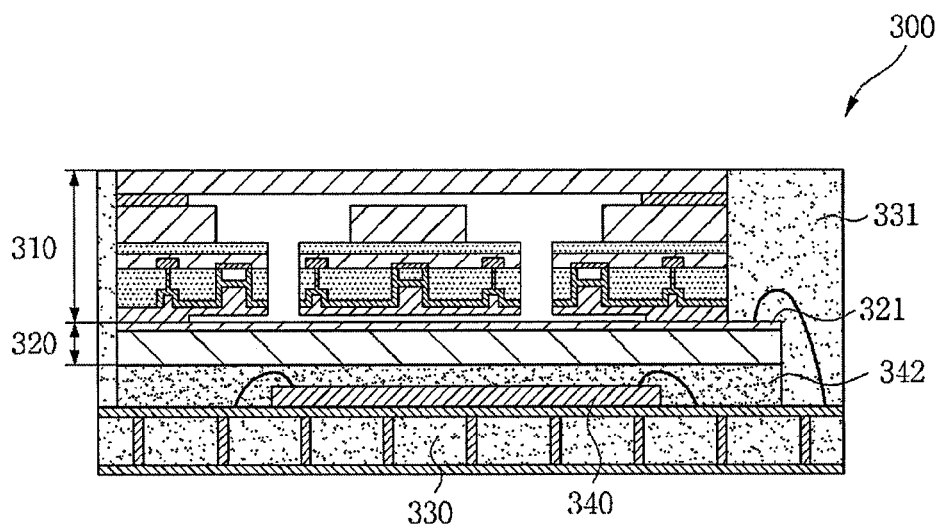
FIG. 3 is a cross-sectional view of a MEMS sensor module package according to a third preferred embodiment of the present invention.

As shown in FIG. 3, the MEMS sensor module package 300 according to the third preferred embodiment of the present invention employs a 6-axis motion sensor as a MEMS sensor 310 and has a stack structure in which an ASIC 320 is stacked under the MEMS sensor 310 with respect to the drawing.

The ASIC 320 and the MEMS sensor 310 may be electrically connected to each other, for example, in a such manner that a pad 321 formed on the ASIC 320 in a vacuum chamber is bonded to the lower side of the MEMS sensor 310. The pad 321 protrudes from the MEMS sensor 310 at the right side of the drawing and it is electrically connected to the upper side of a printed circuit board 330 by wire bonding.

In addition to the ASIC 320 and the MEMS sensor 310 in the stack structure, the printed circuit board 330 may have a three-axis magnetometer stacked thereon as a magnetometer 340. In this case, the magnetometer 340 and the printed circuit board 330 may be electrically connected to each other by wire bonding.

That is, the magnetometer 340 is interposed between the ASIC 320 and the printed circuit board 330 and has its ends to be electrically connected to the printed circuit board 330 by wire bonding, such that a nine-axis motion sensor module may be easily implemented. The magnetometer 340 is firstly sealed by a first molding 342 that is formed by applying a liquid or powder epoxy resin or the like on the printed circuit board 330.

Then, over the printed circuit board 330 on which the magnetometer 340 has been sealed, a molding 331 is formed that covers side surfaces of the ASIC 320 and the MEMS sensor 310 by additionally applying a liquid or powder epoxy resin or the like, to seal them secondly. The molding 331 and the first molding 342 support the stack structure of the MEMS sensor 310, the ASIC 320 and the magnetometer 340 and seals the wire bonding that electrically connects them to one another.

Accordingly, the MEMS sensor module package 300 according to the third preferred embodiment of the present invention may not only improve electrical characteristics by shortening the electrical connection distance between the MEMS sensor 310 and the ASIC 320 but also reduce the size when compared to conventional technologies by implementing the module in substantially the same size with the ASIC 320.

EXAMPLE 4

Figure 4:
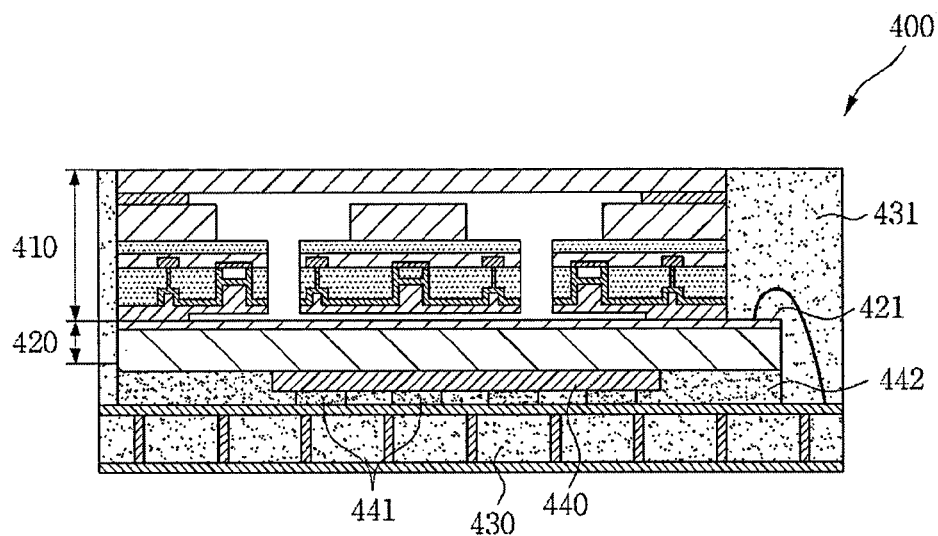
FIG. 4 is a cross-sectional view of a MEMS sensor module package according to a fourth preferred embodiment of the present invention.

As shown in FIG. 4, the MEMS sensor module package 400 according to the fourth preferred embodiment of the present invention employs a 6-axis motion sensor as a MEMS sensor 410 and has a stack structure in which an ASIC 420 is stacked under the MEMS sensor 410 with respect to the drawing.

The ASIC 420 and the MEMS sensor 410 may be electrically connected to each other, for example, in a such manner that a pad 421 formed on the ASIC 420 in a vacuum chamber is bonded to the lower side of the MEMS sensor 410. The pad 421 protrudes from the MEMS sensor 410 at the right side of the drawing and it is electrically connected to the upper side of a printed circuit board 430 by wire bonding.

In addition to the ASIC 420 and the MEMS sensor 410 in the stack structure, the printed circuit board 430 may have a three-axis magnetometer stacked thereon as a magnetometer 440. In this case, the magnetometer 440 and the printed circuit board 430 may be electrically connected to each other by bumps 441 in flip chip packaging.

That is, the magnetometer 440 is interposed between the ASIC 420 and the printed circuit board 430 and is electrically connected to the printed circuit board 430 by bumps 441 to form a stack structure generally, such that a nine-axis motion sensor module may be easily implemented. The magnetometer 440 is firstly sealed by a first molding 442 that is formed by applying a liquid or powder epoxy resin or the like on the printed circuit board 430.

Then, over the printed circuit board 430 on which the magnetometer 440 has been sealed, a molding 431 is formed that covers side surfaces of the ASIC 420 and the MEMS sensor 410 by additionally applying a liquid or powder epoxy resin or the like, to seal them secondly.

The molding 431 and the first molding 442 support the stack structure of the MEMS sensor 410, the ASIC 420 and the magnetometer 440 while seals wire bonding that electrically connects them to one another.

Accordingly, the MEMS sensor module package 400 according to the fourth preferred embodiment of the present invention may not only improve electrical characteristics by shortening the electrical connection distance between the MEMS sensor 410 and the ASIC 420 but also reduce size compared to conventional technologies by implementing the module in substantially the same size with the ASIC 420.

Now, a method of manufacturing a MEMS sensor module package commonly applicable to the first to fourth preferred embodiments will be described in detail with reference to the drawings. It is to be noted that the method of manufacturing a MEMS sensor module package will be described with respect to the third preferred embodiment.

In the method 300 of manufacturing a MEMS sensor module package, the MEMS sensor 310 is bonded on the ASIC 320 and thereby the pad 321 formed on the ASIC 320 makes contact with the lower side of the MEMS sensor 310, to provided a stack structure with electrical connection.

The ASIC 320 and the MEMS sensor 310 may form a stack structure using an ASIC wafer. Further, they may be bonded to each other in a vacuum chamber and may be subject to a dicing process using sawing, to be provided as individual pieces.

Figure 5:
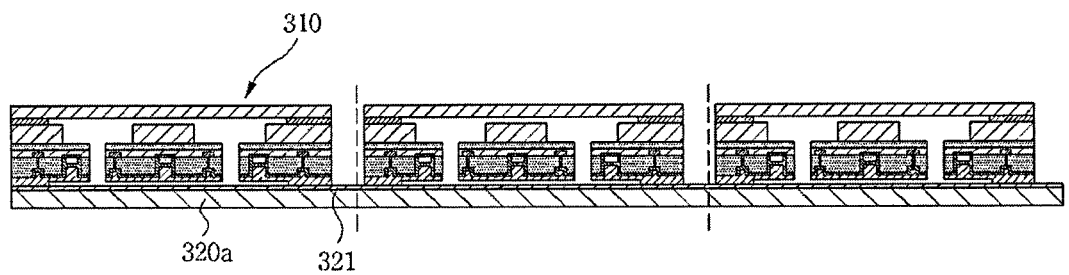
FIGS. 5 through 10 are cross-sectional views illustrating a method of manufacturing a MEMS sensor module package according to a preferred embodiment of the present invention.

As shown in FIG. 5, a stack structure is formed by employing a six-axis motion sensor as the MEMS sensor 310 and stacking it on the ASIC wafer 320a with respect to the drawing. Then, a dicing process is performed by sawing portions of the ASIC wafer 320a exposed between the MEMS sensors 310, to obtain individual pieces.

The ASIC wafer 320a is sawed in a such manner that it is sawed on the same line with the MEMS sensors 310 at the left side of the drawing while it is sawed wider than the MEMS sensors 310 at the right side of the drawing so as to protrude for wire bonding. Accordingly, electrical connection is made by wire bonding with the printed circuit board 330 using the pad 321 protruding from the MEMS sensor 310.

Figure 6:
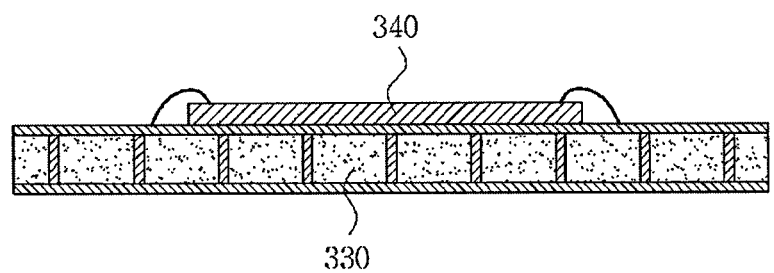
Figure 7:
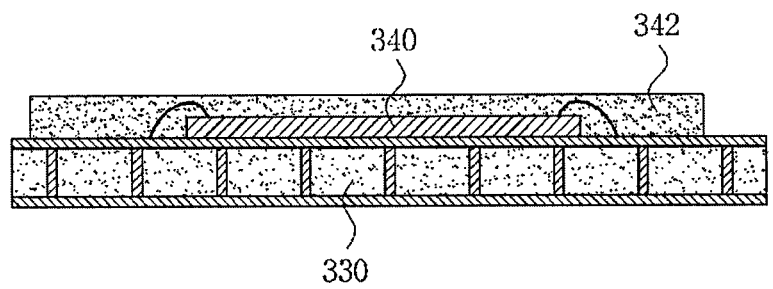

As shown in FIGS. 6 and 7, the printed circuit board 330 has the three-axis magnetometer 340 die-attached thereon and is electrically connected to both sides of the three-axis magnetometer 340 by wire bonding. Then, the first molding 342 is formed by performing encapsulation to apply a liquid or solid powder resin so that the three-axis magnetometer 340 is enclosed.

Figure 8:
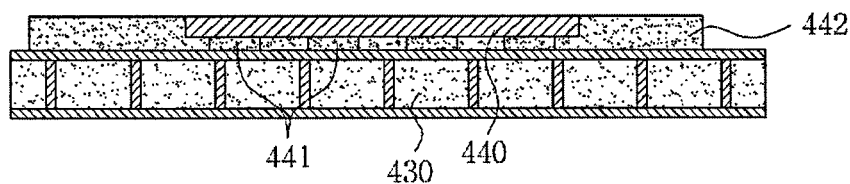

As shown in FIG. 8, the three-axis magnetometer 440 may be die-attached on the printed circuit board 430 in flip chip packaging instead of wire bonding described above.

That is, bumps 441 are formed on the printed circuit board 430 and the lower side of the three-axis magnetometer 440 is soldered onto the bumps 441, to provide electrical connection. Then, the first molding 442 is formed by performing encapsulation to apply a liquid or solid powder resin so that the three-axis magnetometer 440 is enclosed.

Figure 9:
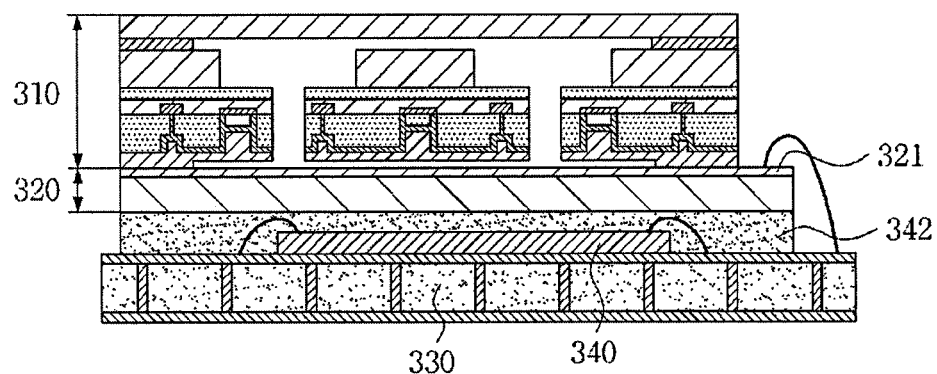
Figure 10:
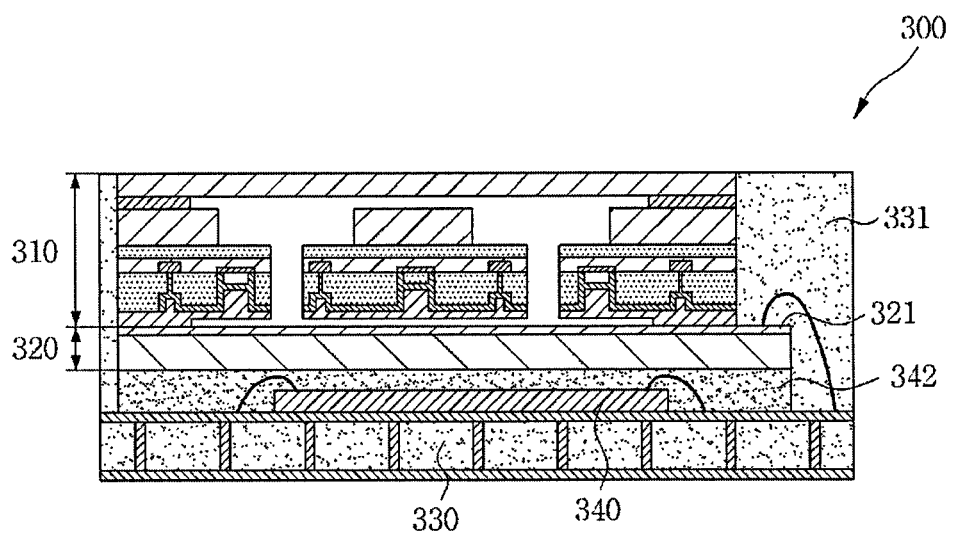

As shown in FIGS. 9 and 10, the ASIC 320 and the MEMS sensor 310 are stacked on the three-axis magnetometer 340 to form a stack structure, and then the pad 321 of the ASIC 320 protruding from the MEMS sensor 310 is electrically connected to the printed circuit board 330 by wire bonding. Then, the molding 331 is formed by performing encapsulation to apply a liquid or solid powder resin so that side surfaces of the ASIC 320 and the MEMS sensor 310 are enclosed.

Accordingly, in the method of manufacturing a MEMS sensor module package according to the preferred embodiment of the present invention, the ASIC 320 and the MEMS sensor 310 are electrically connected to each other without wire bonding so that the electrical connection distance therebetween is shortened to thereby improve electrical characteristics. In addition, the process may be simplified and, in particular, productivity may be improved by simultaneously providing a number of MEMS sensors 310 in a stack structure using ASIC wafers 320a.

As set forth above, according to the present invention, the electrical connection distance between a MEMS sensor and an ASIC is shortened so that an electrical characteristic may be improved. Further, a sensor module package may be implemented in an ASIC size, so that size reduction may be achieved to meet the requirements of mobile devices.

In addition, since a three-axis magnetometer may be interposed between an ASIC and a printed circuit board, the length of wire may be easily shortened so that reliability and the electrical characteristic may be improved.

Further, according to the method of manufacturing a MEMS sensor module package according to a preferred embodiment of the present invention, the process is simpler so that yield rate may be improved, so as to improve productivity. In particular, an ASIC and an MEMS sensor are configured as a stack structure in advance, and one side of the ASIC is wire-bonded, such that size reduction may be easier compared to conventional technologies.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A micro electro mechanical systems (MEMS) sensor module package, comprising:

a printed circuit board (PCB);

an application specific integrated circuit (ASIC) stacked on the PCB, one side of the ASIC being wire-bonded to the PCB;

a MEMS sensor stacked on the ASIC;

a molding encapsulating the MEMS sensor and the ASIC with a resin, and a three-axis magnetometer interposed between the ASIC and the PCB.

2. The MEMS sensor module package as set forth in claim 1, wherein the MEMS sensor is a six-axis motion sensor.

3. The MEMS sensor module package as set forth in claim 1, further comprising a first molding encapsulating the three-axis magnetometer with a resin, wherein the first molding is separate from the molding.

4. The MEMS sensor module package as set forth in claim 1, wherein the three-axis magnetometer is electrically connected to the PCB by wire bonding.

5. The MEMS sensor module package as set forth in claim 1, wherein the three-axis magnetometer is electrically connected to the PCB through bumps.

6. A method of manufacturing a micro electro mechanical systems (MEMS) sensor module package, the method comprising:

(a) stacking a MEMS sensor on an application specific integrated circuit (ASIC);

(b) stacking the ASIC and the MEMS sensor on a printed circuit board (PCB);

(c) wire-bonding one side of the ASIC to the PCB; and (d) encapsulating the ASIC and the MEMS sensor with a resin to form a molding, and stacking a three-axis magnetometer on the PCB so as to be electrically connected thereto, before stacking the ASIC and the MEMS sensor on a printed circuit board (PCB).

7. The method as set forth in claim 6, wherein step (a) comprises attaching the MEMS sensor on an ASIC wafer.

8. The method as set forth in claim 6, wherein the stacking comprises:

die-attaching the MEMS sensor on an ASIC wafer; and dicing the ASIC wafer.

9. The method as set forth in claim 6, wherein the three-axis magnetometer is electrically connected to the PCB through wire bonding or bumps.

10. The method as set forth in claim 6, further comprising encapsulating the three-axis magnetometer with a resin to form a first molding.

11. The method as set forth in claim 6, wherein step (d) includes applying a liquid or powder resin.

* * * * *